Nov. 13, 1962 G. D. JONES 3,064,064

THERMOELECTRIC DEVICES

Filed July 17, 1961

INVENTOR.
GARY D. JONES

BY Walter E. Rule

HIS ATTORNEY 3,064,064

THERMOELECTRIC DEVICES

Gary D. Jones, Louisville, Ky., assignor to General Electric Company, a corporation of New York Filed July 17, 1961, Ser. No. 124,674
3 Claims. (Cl. 136—4)

The present invention relates to thermoelectric devices and is more particularly concerned with thermoelectric heating and cooling devices possessing sufficient flexibility to prevent fracture of the thermoelectric elements.

Thermoelectric devices for heating or cooling applications comprise pairs of dissimilar thermoelectric elements, that is P-type and N-type elements, alternately and serially connected so that when a direct current is passed through the series connected elements there is produced a set of cold junctions and a set of hot junctions. In accordance with the usual practice solid plates of copper, aluminum or other good electrically and heat conducting material soldered to the elements have been employed to connect the dissimilar elements in series. Because of the nature of the materials comprising the thermoelectric elements, these soldered junctions have been relatively weak and many of the failures of thermoelectric heating and cooling devices have been attributable directly to a fracture of the soldered joints or material as a result of thermal or other forces transmitted to the themoelectric elements.

It is a primary object of the present invention to provide a thermoelectric device including flexible means for interconnecting the elements which provide a device capable of withstanding forces which might otherwise fracture the soldered joints.

Another object of the invention is to provide an improved thermoelectric device including flexible junction forming means for the thermoelectric elements of dissimilar thermoelectric properties so arranged with reference to the heat absorbing and heat dissipating surfaces as to absorb those forces tending to fracture the thermocouple joints.

A more specific object of the present invention is to provide a thermoelectric device of a new and improved construction including flexible junction forming means.

Further objects and advantages of the present invention will become apparent as the following description proceeds and the features of novelty which characterize the invention will be pointed out with particularity in the claim annexed to and forming part of this specification.

In carrying out the objects of the present invention, there is provided a thermoelectric device including spaced heat exchange surfaces and a plurality of thermoelectric elements having dissimilar thermoelectric properties arranged between the surfaces and alternately and series connected to form a first or cold set of junctions and a second or hot set of junctions when a direct current is passed through the series connected elements. The ends of the elements forming at least one of these sets of junctions are spaced from one of the surfaces and the junction forming connecting means connecting these ends is in the form of a braided wire cable. This cable, which is preferably of a somewhat U-shaped configuration, has its intermediate or return bend portion in heat exchange connection with one of the surfaces and this intermediate portion is flat to provide a maximum surface for heat exchange thereof with that surface.

For a better understanding of the invention reference may be had to the accompanying drawing in which.

Figure 1:
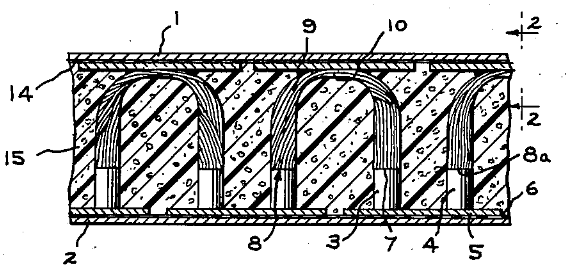
FIG. 1 is a sectional view of a thermoelectric device incorporating the present invention.
Figure 2:
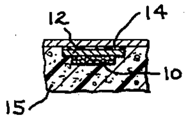
FIG. 2 is a sectional view taken along line 2—2 of FIG. 1.

With reference to FIGS. 1 and 2 of the drawing, there is shown a thermoelectric device such as a heating and cooling panel including spaced heat exchange surfaces 1 and 2. Arranged within the space between the surfaces 1 and 2 are a plurality of dissimilar thermoelectric elements 3 and 4. In the embodiment of the invention illustrated in FIG. 1 pairs of dissimilar P- and N-type elements 3 and 4 have their one ends connected by means of a flat plate of copper or the like 5 to form a thermocouple in which the plate 5 comprises one of the junctions. The plate 5 is in heat exchange relationship with one of the surfaces, specifically surface 2 and is separated therefrom only by means of a thin film of electrically insulating material 6. The elements 3 and 4 extending perpendicularly from plate 5 are rigidly joined to the plate 5 by means of a layer of solder (not shown).

In accordance with the present invention, the other ends 7 and 8 of the elements 3 and 4 which are spaced from the other heat exchanger surface 1 are respectively connected to a dissimilar element forming one of the other thermocouples by means of a flexible braided wire conductor or cable 9. The opposite ends of the flexible braided wire cable 9 are soldered respectively to an element 3 and an element 4. A preferred method of forming the joints between the cable 9 and the ends of the elements 3 and 4 comprises heating the ends of the cable to a temperature such that the individual strands or wires fuse and form flattened ends on the cable. This heating may be carried out by placing each end of the cable against a heated flat surface so that upon fusion there is formed on each end of the cable a flat continuous area which is more suitable for soldering to the ends of the elements 3 and 4 and which gives a greater contact area than would the ends of the individual unfused strands or wires. The cable 9 which is preferably of a somewhat U-shaped cross section has its mid section or return bend 10 flattened as illustrated in FIG. 2 of the drawing and connected by solder or the like to a plate 12 extending parallel to the heat exchange surface 1 and separated therefrom by means of a thin film of electrically insulating material 14. The flattened portion 10 of the cable 9 provides a maximum surface contact of the cable with the plate 12 thereby assuring good heat exchange between these two components. The cable functions not only as a junction forming element but also as a heat conductor for the flow of heat between the elements 3 and 4 and the surface 1. A layer of heat and electrical insulating material 15, such as a foamed resin, fills the space between the heat exchange surfaces 1 and 2 and completely surrounds and embeds the thermocouples and their connecting means.

During the manufacture of thermoelectric devices including a foamed insulation separating the two heat exchange surfaces, pressure is built-up between surfaces 1 and 2 by the expansion of the foam forming resin. Also during use of the device, the usual stresses resulting from differences in the thermal expansion of the components of the thermoelectric device can result in stresses on the soldered joints between the thermoelectric elements and their junctions forming means such as the plates 5 and the cables 9. By employing a flexible braided cable to form one set of junctions, that is either the cold or the hot junctions, it has been found that these and other stresses which have frequently resulted in a fracture of the soldered joints are effectively absorbed by flexing of the cable. In other words, the cable imparts to each thermocouple assembly a flexibility which will enable it to withstand the forces resulting from thermal expansion, distortion or bending of the device including the heat exchange surfaces 1 and 2, as well as the stresses set up during the formation of the foam. For example, during the expansion of the foam forming materials between the surfaces 1 and 2, the curved portions of the flexible cable between the ends of the elements 3 and 4 and the flattened section 10 connected to the plate 14 will tend to straighten or, in other words, act as expansion joints to absorb the expanding forces and substantially prevent their transmission to the soldered joints.

Figure 5:
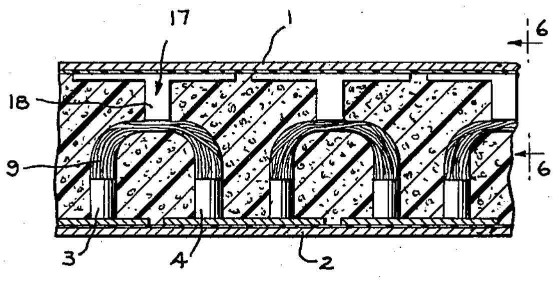
FIG. 5 is a sectional view of another embodiment of the present invention.
Figure 6:
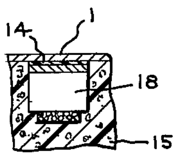
FIG. 6 is a sectional view taken along line 6—6 of FIG. 5.

With reference to FIGS. 5 and 6 there is shown an alternate design for a flexible thermoelectric device which differs from that illustrated in FIGS. 1 and 2 of the drawing primarily in the substitution of T-shaped heat transfer members 17 for the plates 14. By the use of the T-shaped heat transfer members 17 having legs 18 which are connected by means of solder or the like to the flexible cables 9, a shorter length of cable 9 can be used for given spacing between the surfaces 1 and 2 and a better heat flow can be realized due to the better heat transfer characteristics of the solid leg 18 of the member 17 as compared with the braided wire structure of the cables 9. In FIGS. 5 and 6 similar reference numerals have been used to indicate the same or similar components.

Figure 3:
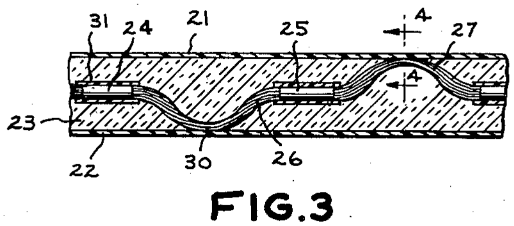
FIG. 3 is a sectional view of modifications of the present invention.
Figure 4:
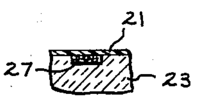
FIG. 4 is a view along line 4—4 of FIG. 3.

The modification of the invention illustrated in FIGS. 3 and 4 of the drawing is particularly adapted for applications requiring a maximum degree of flexibility of the thermoelectric device as for example in flexible heating or cooling panels, blankets or the like. In this modification of the invention, the heat exchange surfaces 21 and 22 of the device may be composed of an electrically insulating material such as a thin sheet of plastic or the like and a flexible foam or fiberglass is used as the insulation 23 filling the space between the surfaces 21 and 22. The thermoelectric elements 24 and 25 of dissimilar thermoelectric properties are arranged in spaced relationship with both the surfaces 21 and 22 and alternate dissimilar elements are electrically connected by means of flexible cables 26 and 27 comparable to the cable 9 previously described. The cables 26 which form junctions of one type, that is either cold or hot junctions depending upon the direction in which the current is passed through the interconnected thermoelectric elements, are in heat exchange with one of the surfaces, for example surface 22, while the alternate cables 27 forming the opposite junctions are in heat exchange with the other surface 21. As flexible braided cables are employed in this embodiment of the invention for connecting all of the thermoelectric elements, the product posses maximum flexibility. The intermediate portions 30 of each of the cables are in direct heat exchange contact with the adjacent surfaces and are preferably flattened for maximum heat flow contact. They may be secured to the surfaces by a suitable cement or plastic capable of adhering to the material comprising the heat exchange surfaces. If desired each of the elements and the adjacent portions of the cables connected thereto may also be encapsulated by means of an epoxy resin 31 or the like to increase the strength of the elements and the soldered joints between these elements and the cables.

The braided conductors or cables are preferably composed of relatively fine wires or strands to provide the flexibility of this component as required to protect the soldered joints as well as the thermoelectric elements 3 and 4 from the stresses resulting from expansion of the foam or other components of the device or from flexing of the device when it is part of a flexible cooling panel or the like.

While the invention has been described with reference to particular embodiments thereof, it will be understood that the invention is not limited thereto and it is intended by the appended claims to cover all such modifications as fall within the true spirit and scope of the invention.

What I claim as new and desire to secure by Letters Patent of the United States is:

1. A thermoelectric device comprising spaced heat absorbing and heat dissipating surfaces, a plurality of P-type and N-type elements disposed in the space between said surfaces and in spaced relationship with at least one of said surfaces, means for series connecting said elements to form a set of heat absorbing junctions and a set of heat dissipating junctions, each of the junctions of at least one of said sets comprising a flexible braided wire conductor having the opposite ends thereof respectively joined to a P-type element and an N-type element and a flat intermediate portion in heat exchange relation with said one of said surfaces.

2. A thermoelectric device comprising spaced heat exchange surfaces, a plurality of thermocouples each composed of thermoelectrically dissimilar elements connected at their one ends by means of a flat plate, said plates being adjacent and in heat exchange relation with one of said surfaces, said elements having their outer ends in spaced relation with the other of said surfaces, flexible multi-strand wire cables connecting said thermocouples in series, each of said cables being substantially U-shaped and including a flat intermediate section, and heat exchange means connected to said flat intermediate section and in heat exchange relation with the other of said surfaces.

3. A thermoelectric device comprising spaced heat exchange surfaces, a plurality of thermocouples each composed of thermoelectrically dissimilar elements connected at their one ends by means of a flat plate, said plates being adjacent and in heat exchange relation with one of said surfaces, said elements extending perpendicular to said plate and having their other ends in spaced relation with the other of said surfaces, flexible multi-strand wire cables connecting said thermocouples in series, each of said cables being substantially U-shaped and including a flat intermediate section, and a metal plate connected to each of said intermediate sections and in heat exchange with the other of said surface.

References Cited in the file of this patent

UNITED STATES PATENTS

| | | |
|---|---|---|
| 2,938,356 | McMahon | May 31, 1960 |
| 2,980,746 | Claydon | Apr. 18, 1961 |
| 2,997,514 | Roeder | Aug. 22, 1961 |